(12) United States Patent
Ukawa et al.

(10) Patent No.: US 10,103,299 B2
(45) Date of Patent: *Oct. 16, 2018

(54) LIGHT EMITTING DEVICE

(71) Applicant: NICHIA CORPORATION, Anan-shi (JP)

(72) Inventors: Hiroaki Ukawa, Anan (JP); Yusuke Hayashi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/638,373

(22) Filed: Jun. 30, 2017

(65) Prior Publication Data

US 2017/0301837 A1   Oct. 19, 2017

Related U.S. Application Data

(63) Continuation of application No. 15/281,080, filed on Sep. 30, 2016, now Pat. No. 9,728,690.

(30) Foreign Application Priority Data

Sep. 30, 2015   (JP) .................................. 2015-195194

(51) Int. Cl.
*H01L 33/56*   (2010.01)
*H01L 33/48*   (2010.01)
(Continued)

(52) U.S. Cl.
CPC .............. *H01L 33/56* (2013.01); *H01L 33/44* (2013.01); *H01L 33/486* (2013.01); *H01L 33/62* (2013.01);
(Continued)

(58) Field of Classification Search
CPC combination set(s) only.
See application file for complete search history.

(56) References Cited

U.S. PATENT DOCUMENTS 7,714,342 B2   5/2010   Lee et al.
7,935,975 B2   5/2011   Ishii et al.
(Continued)

FOREIGN PATENT DOCUMENTS

JP   2001-044234   2/2001
JP   2009-135381   6/2009
(Continued)

OTHER PUBLICATIONS

Notice of Allowance with Form PTO-892 Notice of References Cited issued by the U.S. Patent and Trademark Office for the parent U.S. Appl. No. 15/281,080, dated Apr. 10, 2017.

*Primary Examiner* — Mamadou Diallo
(74) *Attorney, Agent, or Firm* — Mori & Ward, LLP (57) ABSTRACT

A light emitting device includes a base member, a light emitting element, a wire, a protective film, first and second resin members, and a light shielding portion. The base member has a conductive member. The wire connects the light emitting element and the conductive member. The protective film covers the conductive member to be spaced apart from a portion of a connecting portion. The first resin member has a first gas barrier property with respect to hydrogen sulfide and a first light resistance. The second resin member has a second gas barrier property with respect to hydrogen sulfide lower than the first gas barrier property and a second light resistance higher than the first light resistance. The light shielding portion is disposed on a surface of the base member and disposed on a line connecting the light emitting element and the first resin member.

12 Claims, 6 Drawing Sheets

(51) Int. Cl.
  *H01L 33/44*  (2010.01)
  *H01L 33/62*  (2010.01)
  *H01L 33/60*  (2010.01)

(52) U.S. Cl.
  CPC .... *H01L 33/60* (2013.01); *H01L 2224/48091* (2013.01); *H01L 2224/48095* (2013.01); *H01L 2224/48137* (2013.01); *H01L 2224/48227* (2013.01); *H01L 2224/48471* (2013.01); *H01L 2224/8592* (2013.01); *H01L 2924/181* (2013.01); *H01L 2933/005* (2013.01); *H01L 2933/0066* (2013.01)

(56) References Cited

U.S. PATENT DOCUMENTS

| | | |
|---|---|---|
| 8,049,230 B2 | 11/2011 | Chan et al. |
| 2004/0169451 A1 | 9/2004 | Oishi et al. |
| 2007/0235746 A1* | 10/2007 | Mitsuyama ............ H01L 33/60 257/98 |
| 2009/0108282 A1 | 4/2009 | Matsuda et al. |
| 2010/0025709 A1* | 2/2010 | Koseki .................... H01L 33/56 257/98 |
| 2010/0230693 A1 | 9/2010 | Tran |
| 2015/0021640 A1 | 1/2015 | Oka et al. |
| 2015/0299465 A1 | 10/2015 | Toyota et al. |
| 2015/0307717 A1 | 10/2015 | Kojima |
| 2016/0155907 A1 | 6/2016 | Ozeki et al. |

FOREIGN PATENT DOCUMENTS

| | | |
|---|---|---|
| JP | 2009-224538 | 10/2009 |
| JP | 2011-100905 | 5/2011 |
| JP | 2014-041955 | 3/2014 |
| JP | 2015-008237 | 1/2015 |

* cited by examiner

LIGHT EMITTING DEVICE

CROSS-REFERENCE TO RELATED APPLICATIONS

The present application is a continuation application of the U.S. patent application Ser. No. 15/281,080 filed Sep. 30, 2016, which claims priority under 35 U.S.C. § 119 to Japanese Patent Application No. 2015-195194, filed Sep. 30, 2015. The contents of this application are incorporated herein by reference in their entirety.

BACKGROUND

1. Technical Field

The present disclosure relates to a light emitting device.

2. Description of the Related Art

In recent years, light emitting diodes (hereinafter also referred to as "LEDs"), which consume smaller power, have been entering widespread use as substitute for conventional incandescent lamps in lighting fixtures for general illuminating devices. Also, the application field of LEDs is expanded to various fields such as backlight-use, illumination, vehicular-use and the like. In particular, an LED using a nitride-based semiconductor has a wide bandgap and is capable of emitting short wavelength light, and has been widely used in recent years. Such light emitting devices each employs the structure in which a light emitting element is sealed with a resin.

Metal members such as silver are used for the electrode members of a light emitting device. With this arrangement, the resin is permeable to gas, which allows the metal members to be sulfurized and deteriorated with use, so that a connecting portion of a wire connecting an LED and a conductive member may be broken. Accordingly, an attempt has been made to reduce deterioration of the connecting portion of the wire by forming a protective film made of an inorganic material by sputtering (e.g., JP 2009-224538 A).

SUMMARY

According to one aspect of the present invention, a light emitting device includes a base member, a light emitting element, a wire, a protective film, a first resin member, a second resin member, and a light shielding portion. The base member has a conductive member containing silver. The light emitting element is disposed on the base member. The wire electrically connects the light emitting element and the conductive member. The protective film covers the conductive member so as to be spaced apart at least from a portion of a connecting portion connecting the wire and the conductive member. The first resin member continuously covers at least a portion of each of the protective film, a portion of the conductive member around the connecting portion, and the wire. The first resin member has a first gas barrier property with respect to hydrogen sulfide and a first light resistance. The second resin member covers the light emitting element and the first resin member. The second resin member has a second gas barrier property with respect to hydrogen sulfide lower than the first gas barrier property and a second light resistance higher than the first light resistance. The light shielding portion is disposed on at least a portion of a surface of the base member. The light shielding portion is disposed on a line connecting the light emitting element and the first resin member.

BRIEF DESCRIPTION OF THE DRAWINGS

A more complete appreciation of the invention and many of its attendant advantages thereof will be readily obtained as the same becomes better understood by reference to the following detailed description when considered in connection with the following accompanying drawings, wherein.

DESCRIPTION OF THE EMBODIMENTS

The embodiments will now be described with reference to the accompanying drawings, wherein like reference numerals designate corresponding or identical elements throughout the various drawings.

In the following, a description will be given of embodiments of the present invention with reference to the drawings. The embodiments shown below are intended as illustrative to give a concrete form to technical ideas of the present invention, and the scope of the present invention is not limited to those described below. Further, the present specification is not intended to limit members shown in the claims to members in the embodiments. In particular, the sizes, materials, shapes, the relative positions etc. of the members described in the embodiments are given not as a limitation to the scope of the present invention, unless otherwise specified. The size, positional relationship or the like of the members shown in the drawings may be exaggerated for the sake of clarity. In the description below, the same designations or the same reference numerals denote the same or like members and detailed descriptions will be appropriately omitted. Further, a plurality of structural elements according to the embodiments of the present invention may be configured as a single part which serves the purpose of a plurality of elements. On the other hand, a single structural element may be configured as a plurality of parts which serve the purpose of a single element. Further, the description given in one example or one embodiment can also be applied in other examples or embodiments.

First Embodiment

Figure 1:
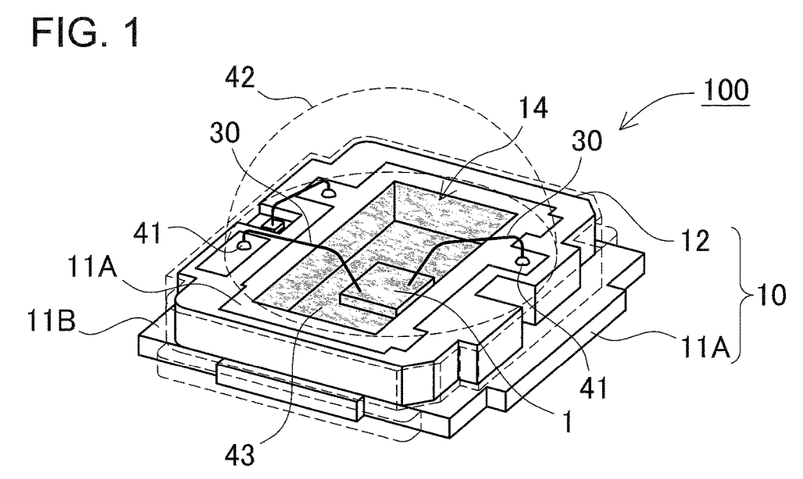
FIG. 1 is a perspective view of a light emitting device according to a first embodiment of the present invention.
Figure 2:
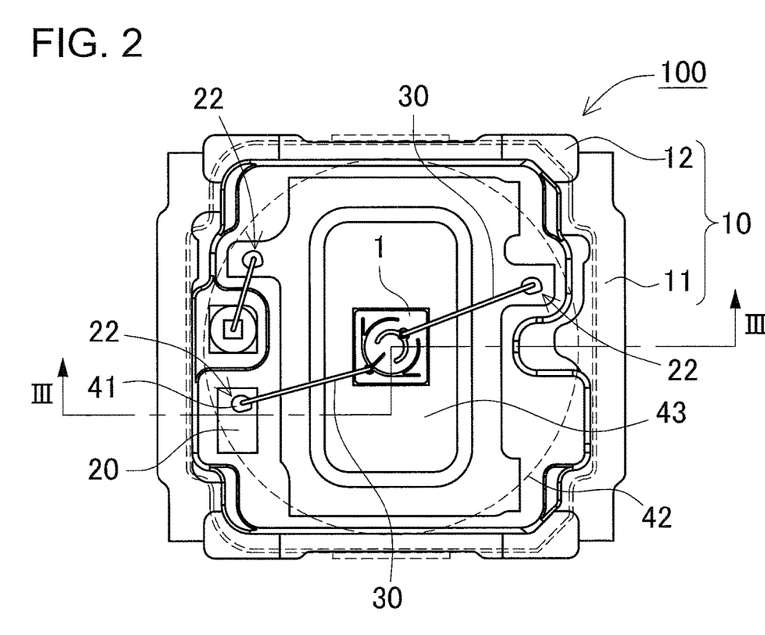
FIG. 2 is a plan view of the light emitting device shown in FIG. 1.
Figure 3:
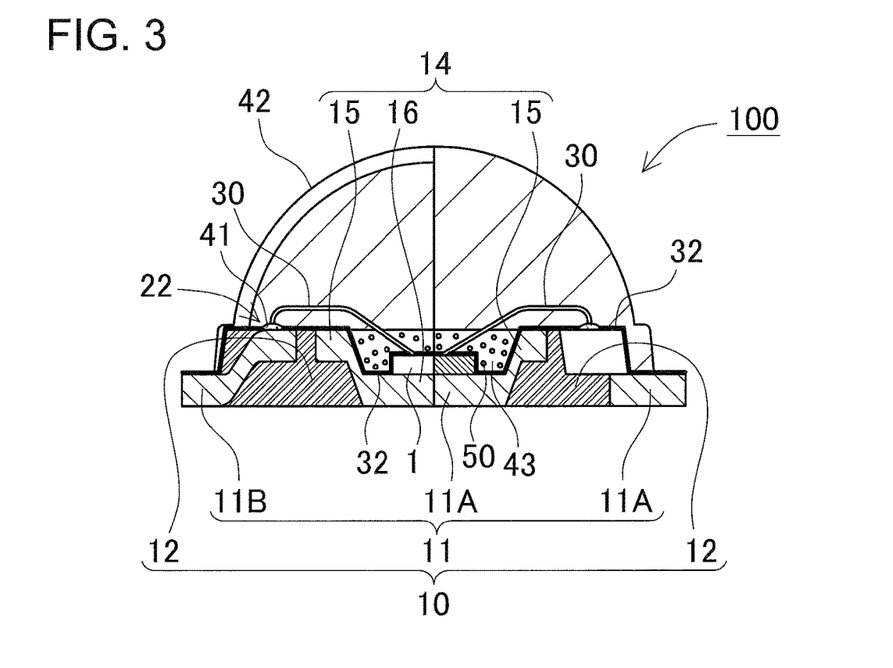
FIG. 3 is a cross-sectional view taken along line III-III of FIG. 2.
Figure 4:
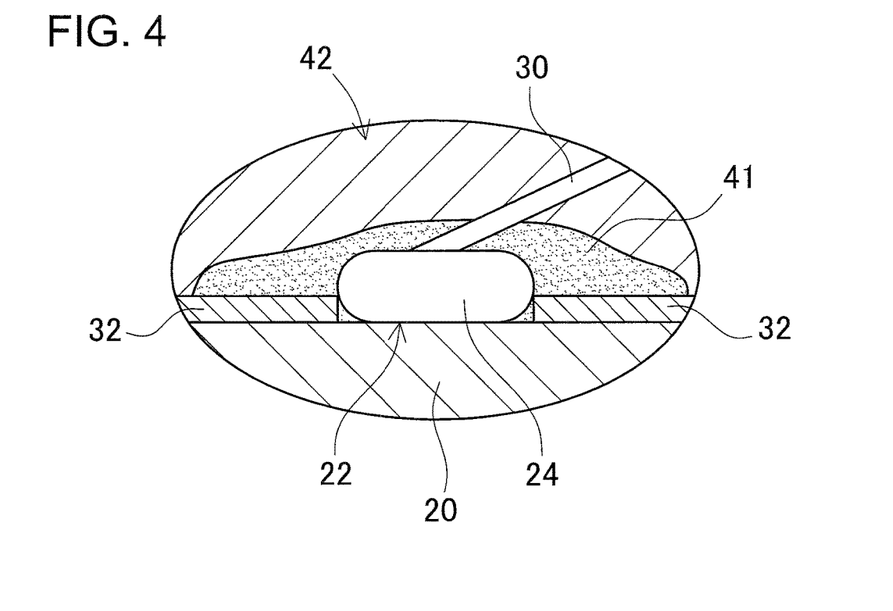
FIG. 4 is an enlarged cross-sectional view of a section where a connecting portion shown in FIG. 3 is covered by a first resin member.

FIGS. 1 to 4 show a light emitting device according to a first embodiment of the present invention. FIG. 1 is a perspective view of a light emitting device 100 according to the first embodiment of the present invention. FIG. 2 is a plan view of the light emitting device 100 shown in FIG. 1. FIG. 3 is a cross-sectional view taken along line III-III of FIG. 2 in which wire is omitted for ease of illustration. FIG. 4 is an enlarged cross-sectional view of a section where a connecting portion 22 shown in FIG. 3 is covered by a first resin member 41. The light emitting device 100 shown in FIGS. 1 to 4 includes a base member 10, and a light emitting element 1 mounted on the base member 10. As shown in a cross-sectional view in FIG. 3, a recess 14 is formed in one surface (the upper surface in the drawing) of the base member 10. Note that, the recess 14 is defined by a side wall portion 15 and a bottom portion 16. The light emitting element 1 is disposed at the bottom portion 16 of the recess 14.

Base Member 10

The base member 10 includes a conductive member containing silver, and an insulating base material. The conductive member may be metal members containing silver that constitute leads or wirings. In the case where the conductive member is made of leads, for example, the conductive member may each include: a base material that is a single layer or a layered body of metal such as silver, copper, aluminum, gold, tungsten, iron, nickel, cobalt, molybdenum or alloy of these metals, phosphor bronze, and copper-iron alloys; and a reflecting film containing silver formed on a surface of the base material.

In the case where the conductive member is made of wirings, for example, the conductive member may include: a base material that is a single layer or a layered body of metal such as silver, copper, nickel, palladium, rhodium, tungsten, chromium, titanium, aluminum, gold or alloy of these metals; and a reflecting film containing silver formed on the surface of the base material. Note that, in the case where the base material of the conductive member contains silver, the leads or the wirings may not include the reflecting film containing silver.

Examples of the reflecting film containing silver include a silver film, a silver alloy film, a film of silver to which impurities are doped and the like. Examples of the silver alloy include silver-gold alloy. The impurities added to silver may be metals such as gold or copper, sulfur, selenium and the like. The reflecting film containing silver may be any of a single layer or a layered structure, and normally has a structure such that a surface of the conductive member contains silver.

The reflecting film containing silver may be formed on the conductive member by any appropriate method, and examples thereof includes plating, vapor deposition, sputtering, ion beam assisted deposition and the like. The reflecting film containing silver may have a thickness enough to effectively reflect light from the light emitting element. The thickness may be, for example, in a range of about 20 nm to 10 µm, preferably about 50 nm to 5 µm, and more preferably about 100 nm to 3 µm. The thickness and shape of the conductive member can be appropriately selected within a range known in the art.

Examples of the insulating base material include a ceramic, a resin (including fiber-reinforced resin) or the like.

Examples of the ceramic include alumina, aluminum nitride, and the like. Examples of the resin include thermosetting resin such as epoxy resin, silicone resin, BT resin, polyimide resin, and unsaturated polyester resin, thermoplastic resin such as polyphthalamide resin and nylon resin, modified resin of these resins, or hybrid resin including one or more of these resins. The base material may have a single-layer structure or a layered structure. Further, the base material may contain a coloring agent, filler, reinforcing fibers or the like known in the art. In particular, the coloring agent preferably is made of a material that exhibits excellent reflectivity and has a white color, such as titanium oxide, zinc oxide or the like. Examples of the filler include silica and alumina. Examples of the reinforcing fibers include glass, calcium silicate, and potassium titanate.

In FIG. 3, the conductive member is made of metal leads 11. The base material 12 is formed of an insulating resin. The leads 11 include a first lead 11A and a second lead 11B. One of the first lead 11A and the second lead 11B serves as a positive external connection terminal, and the other serves as a negative external connection terminal. At least a part of the conductive member may define the recess 14. The conductive member is made of a metal containing silver, and has high reflectivity. With this structure, light reflectivity at the side wall portion 15 and/or at the bottom portion 16, can be improved, which can improve the light output of the light emitting device. In particular, it is preferable that all surfaces of the side wall portion 15 and the bottom portion 16 facing the light emitting element 1, which define the recess, is made of the conductive member. With this structure, the light output of the light emitting device can be further improved.

The bottom portion 16 may have an area at least enough for the light emitting element 1 to be mounted thereon. The shape of bottom 16 may be, for example, a circle, an ellipse, a rounded polygon, or any of deformed shapes of these. Though the side wall portion 15 may be perpendicular to the bottom portion 16, preferably the side wall portion 15 is inclined such that the width of the recess 14 in a cross-sectional view is narrowed toward the bottom portion 16. For example, the side wall portion 15 is inclined in a range of about 0° to 45°, about 20° to 40° with respect to a direction perpendicular to the bottom portion 16. Thus, the light from the light emitting element 1 can be efficiently guided to an upper surface of the base member 10.

The conductive member preferably projects from the lateral surfaces of the base material 12. An increase in the volume of the conductive member can improve the heat releasing property. Further, the lower surface of the conductive member is preferably exposed outside the base material 12. This arrangement increases an area where the substrate and the conductive member are in contact with each other when the base member 10 is mounted on the substrate, which can improve the heat releasing property.

Light Emitting Element 1

The light emitting element 1 is mounted on the bottom portion 16 of the recess 14. The light emitting element 1 is a semiconductor element that emits light by being applied with voltage, and a known semiconductor light emitting element made of a nitride semiconductor or the like can be employed. Further, the light emitting element 1 of any wavelength may be selected to emit light of desired color. More specifically, for a light emitting element to emit blue light (whose wavelength is 430 nm or greater and smaller than 490 nm) or green-color light (whose wavelength is 490 nm or greater and smaller than 570 nm), a nitride-based semiconductor represented by $In_XAl_YGa_{1-X-Y}N$ ($0 \leq X$, $0 \leq Y$, $X+Y \leq 1$) may be employed. For a light emitting element to emit red-color light (whose wavelength is 620 nm or greater and smaller than 750 nm), an arsenic-based compound or phosphorus-based compound semiconductor represented by GaAlAs, AlInGaP or the like may be employed. Further, a light emitting element having light emission color varied by the mixed-crystal ratio may be employed. For a growth substrate of such semiconductor elements, a substrate of the hexagonal crystal system such as sapphire, GaN or the like may be used.

Wire 30

The light emitting element 1 and the conductive member are electrically connected to each other by at least one wire 30. It should be noted that a light emitting element may have one wire, or two or more wires. The wire 30 is made of a metal material having good electrical conductivity, e.g., gold, aluminum, copper, silver or the like. The wire 30 may be appropriately formed by any known method such as ball bonding or wedge bonding. In the case of using ball bonding method, a ball 24 is formed at a tip of each wire 30 in advance. For example, in the case where the wire is a gold wire, the tip of each gold wire is molten by electric discharge from an electric torch or the like, so that the ball 24 is formed. The enlarged cross-sectional view of FIG. 4 shows an example of such ball bonding. Forming the ball 24 at the tip of the wire 30 allows for increasing the area where the wire 30 and the conductive member 20 are in contact with each other, which can suppress disconnection of the wire. Note that the ball 24 is a part of the wire 30.

Protective Film 32

The protective film 32 covers at least a part of the conductive member. With the protective film 32 covering the conductive member, contact between the conductive member and hydrogen sulfide can be suppressed, which can reduce sulfurization of the conductive member. Further, the light emitting element 1 may also be covered by the protective film 32. With the protective film 32 continuously covering the conductive member and the light emitting element 1, a portion of the conductive member around the light emitting element 1 can be easily covered. This can reduce discoloration of a portion of the conductive member around the light emitting element 1 due to sulfurization, which allows for maintaining the output. The protective film 32 is preferably made of a material having good insulating property and light-transmissivity such as aluminum oxide, silicon nitride, aluminum nitride, titanium oxide, tantalum oxide or the like. The protective film 32 may be formed by any known growth method such as sputtering, vacuum deposition or the like. In particular, forming the protective film 32 by sputtering is preferable because it can enhance adhesion between the protective film 32 and the conductive member.

However, around at least one connecting portion 22 connecting the wire 30 and the conductive member, a space between the wire 30 and a portion masked by the wire 30 is narrow. Accordingly, it is not easy to form the protective film 32 covering a portion of the conductive member around the connecting portion 22 in that space. For example, in the case of forming the protective film 32 by vacuum deposition, a vaporized or sublimated material of the protective film 32 less easily extend to such narrow space, which may lead to difficulty in forming the protective film 32. In particular, in the case of using the method in which the material of the protective film travels linearly from the supply source to a portion on which the protective film is to be formed, such as sputtering, the material of the protective film 32 may not be easily applied to the portion of the conductive member that is located around the connecting portion 22 connecting the wire 30 and the conductive member and masked by the wire 30. Accordingly, the protective film 32 may not be easily formed. Thus, at least a portion of the portion of the conductive member around the connecting portion 22 may not be covered by the protective film 32. That is, the protective film 32 is easily spaced apart from at least a part of the connecting portion 22 connecting the wire 30 and the conductive member. Note that, the portions masked by the wire 30 refers to portions under the wire 30. Also, it should be noted that a light emitting device may has one connecting portion or more, corresponding to the number of wire.

First Resin Member 41

With such structure, silver contained in the portion of the conductive member around the connecting portion 22 may be sulfurized by hydrogen sulfide contained in the air and deteriorate, which may result in disconnection of the wire. For this reason, at least a part of each of the protective film 32, the portion of the conductive member around the connecting portion 22, and the wire 30 is continuously covered by a first resin member 41 that exhibits high gas barrier property with respect to hydrogen sulfide. That is, at least a part of the conductive member not covered by the protective film 32 is covered by the first resin member 41.

This arrangement is shown in the enlarged cross-sectional view of FIG. 4 in which the connecting portion 22 in FIG. 3 is shown enlarged. As shown in FIG. 4, the first resin member 41 continuously covers at least a part of each of the protective film 32, the portion of the conductive member 20 around the connecting portion, and the wire 30. In particular, it is preferable to continuously cover the region from the conductive member 20 to an edge of the protective film 32, which allows for protecting the conductive member 20 without exposing to the outside. The material of the first resin member 41 is appropriately selected, and examples thereof include polycarbonate resin, epoxy resin, phenolic resin, silicone resin, acrylic resin, TPX resin, polynorbornene resin, modified resin of these resins, and hybrid resin containing at least one of these resins. In particular, a resin having a carbon-carbon bond is preferable for the material of the first resin member 41, because a carbon-carbon bond-based material exhibits relatively high gas barrier property and less easily transmits hydrogen sulfide. Examples of a resin having a carbon-carbon bond include epoxy resin.

In the present specification, the gas barrier property is an index showing permeability with respect to hydrogen sulfide, and refers to a gas permeability coefficient with respect to hydrogen sulfide, for example. The unit of the gas permeability coefficient may be $cm^3 \cdot cm/(m^2 \cdot 24 \, hrs \cdot atm)$, $cm^3 \cdot cm/(cm^2 \cdot s \cdot cmHg)$ or the like. In the case where the gas permeability coefficient with respect to hydrogen sulfide of a member cannot be measured because of the size of the member or the like, the member is specified, and a refractive index of a material similar to the specified component is measured. Then, the gas permeability coefficient in relation to hydrogen sulfide of the specified component can be deduced from the measurement result of the similar material. Further, in the case where it is difficult to measure the gas permeability coefficient with respect to hydrogen sulfide, a water vapor permeability coefficient may be used. The unit of the water vapor permeability coefficient may be $ng/(m \cdot s \cdot Pa)$ or the like.

Resins exhibiting excellent gas barrier property is generally poor in light resistance. Accordingly, such resin may be deteriorated due to being exposed to light emitted by the light emitting element. For this reason, in the present embodiment, the upper surface of the light emitting element 1 is located to be lower than the upper surface of the side wall portion 15 defining the recess 14 in the case where the light emitting element 1 is mounted on the bottom portion 16 of the recess 14. Thus, the connecting portion 22 connecting the wire 30 and the conductive member 20 are not directly irradiated with light from the light emitting element 1. With the connecting portion 22 not being directly irradiated with light from the light emitting element 1, deterioration of first resin member 41 that covers the portion of the conductive member 20 around the connecting portion 22 due to light from the light emitting element 1 can be reduced. Further, the first resin member 41 is preferably spaced apart from lateral surfaces of the side wall portion 15. The first resin member 41 is not formed on the lateral surfaces of the side wall portion 15, which allows the first resin member 41 not to be easily irradiated with light from the light emitting element 1, and therefore deterioration of the first resin member 41 due to light can be reduced. In particular, it is preferable that the entire first resin member 41 is disposed outside the region that is directly irradiated with light from the light emitting element 1. With this arrangement, deterioration of the first resin member 41 due to light from the light emitting element 1 can be reduced. The portion of the conductive member 20 around the connecting portion 22 is not easily sulfurized, which can prevent disconnection between the wire 30 and the conductive member 20.

Note that, light emitted from the light emitting element 1 includes not only light directly emitted from the light emitting element 1 (primary light) but also light reflected/refracted by a second resin member (secondary light), which will be described later. The light directly emitted by the light emitting element 1 (the primary light) can be defined as a straight line connecting a surface of the light emitting element 1 and a light shielding member (e.g., the base member) surrounding the light emitting element 1.

Though the thickness of the first resin member 41 may be appropriately selected, a thickness in a range of 50 µm to 200 µm is preferable. In the case where the thickness of the first resin member 41 is greater than 200 µm, the first resin member 41 can be easily be irradiated with light from the light emitting element 1, so that the first resin member 41 can be easily deteriorated by light. Further, in the case where the thickness of the first resin member 41 is smaller than 50 µm, the portion of the conductive member around the connecting portion 22 cannot be easily covered by the first resin member 41.

First Light Reflecting Particles

The first resin member 41 may contain first light reflecting particles. With this arrangement, a part of light emitted by the light emitting element 1 is reflected by the first light reflecting particles. Accordingly, the amount of light incident on the first resin member 41 can be reduced, which allows for reducing deterioration of the first resin member 41. Further, light reflected by the first light reflecting particles can serve as the output light, which allows for improving the light extraction efficiency. Though the material of the first light reflecting particles may be appropriately selected, titanium oxide, aluminum oxide, calcium carbonate or the like may be suitably employed.

Though the shape of the first resin member 41 may be appropriately selected, it is preferable that the first resin member 41 has a circular outer shape in a plan view. This can facilitate formation of the first resin member 41. For example, during manufacture of the light emitting device, uncured resin to be form the first resin member 41 may be applied by potting. Applying uncured first resin member 41 in a liquid state allows the resin to enter a space that is difficult to be filled with the protective film formed by sputtering or the like. That is, while the protective film 32 is formed by sputtering or the like, a portion where the protective film 32 failed to be formed can be covered by the first resin member 41.

Further, the viscosity of the uncured first resin member 41 can be adjusted by adding filler or the like, which allows the insulating first resin member 41 supplied by potting not to spread exceeding a required region. Further, adjustment of the viscosity can improve shape retainability of the first resin member 41, and the first resin member 41 is easily controlled to stay at the intended location. Though the diameter of the circular shape of the cured first resin member 41 may be appropriately selected, it is preferably in a range of 30 µm to 800 µm. In the case where the diameter of the circular shape of the first resin member 41 is greater than 800 µm, the first resin member 41 can be easily irradiated with light from the light emitting element 1, so that the first resin member 41 can easily be deteriorated by light. Further, in the case where the diameter of the circular shape of the first resin member 41 is smaller than 30 µm, the portion of the conductive member around the connecting portion 22 cannot be easily covered by the first resin member 41. Though the weight of the filler added to the first resin member 41 may be appropriately selected, the filler is preferably added by 0.5% to 1.5% with respect to the weight of the first resin member 41. Adding the filler of an amount in this range allows the filler to have a viscosity at which the uncured first resin member 41 easily enters the space while less easily spreads exceeding a required region.

Second Resin Member 42

The light emitting device further includes a second resin member 42 that covers the light emitting element 1 and the first resin member 41. The second resin member 42 has lower gas barrier property with respect to hydrogen sulfide than that of the first resin member 41. That is, the gas permeability coefficient with respect to hydrogen sulfide of the first resin member 41 is lower than the gas permeability coefficient with respect to hydrogen sulfide of the second resin member 42. With this arrangement, the portion of the conductive member around the connecting portion 22 connecting the wire 30 and the conductive member is covered by the first resin member 41 that less easily transmits hydrogen sulfide, which can prevent sulfurization, so that the wire 30 can be prevented from disconnecting.

The ratio between the gas permeability coefficient of the first resin member 41 with respect to hydrogen sulfide and the gas permeability coefficient of the second resin member 42 with respect to hydrogen sulfide is preferably 1:2, more preferably 1:5, and further preferably 1:10, while it may be appropriately selected as long as the gas permeability coefficient of the first resin member 41 with respect to hydrogen sulfide is lower than the gas permeability coefficient of the second resin member 42 with respect to hydrogen sulfide. Note that, also in the case where the water vapor permeability coefficient is employed in place of the gas permeability coefficient with respect to hydrogen sulfide, the ratio between the gas permeability coefficient of the first resin member 41 with respect to hydrogen sulfide and the gas permeability coefficient of the second resin member 42 is preferably 1:2, more preferably 1:5, and further preferably 1:10. With such ratio, the first resin member 41 more hardly transmits hydrogen sulfide, and disconnection of the wire 30 can be prevented.

Since the second resin member 42 is arranged at a position where it is directly irradiated with light emitted by the light emitting element 1, the second resin member 42 preferably has a light resistance greater than that of the first resin member 41. With high heat resistance, the second resin member 42 is less easily deteriorated although the second resin member 42 faces the upper surface of the light emitting element 1 as shown in the cross-sectional view of FIG. 3, which allows for improving the reliability of the light emitting device. On the other hand, even in the case where the second resin member 42 has lower gas barrier property than that of the first resin member 41, covering the portion of the conductive member around the connecting portion 22, at which disconnection of the wire may occur, by the first resin member 41 having good gas barrier property with respect to hydrogen sulfide can reduce sulfurization of the conductive member, which allows for reducing disconnection of the wire.

The materials for the second resin member 42 is appropriately selected, and examples thereof include polycarbonate resin, epoxy resin, phenolic resin, silicone resin, acrylic resin, TPX resin, polynorbornene resin, modified resin of the these resins, or hybrid resin containing at least one of these resins. In particular, for the material of the second resin member 42, dimethyl-based silicone resin or phenyl-based silicone resin, which exhibit good light resistance, is preferably used.

Though the second resin member 42 may have an appropriate shape, it preferably has a lens-shape. With a lens-shape, light from the light emitting element 1 being reflected at the interface between the lens and the air can be reduced, so that the light extraction efficiency can be improved. Further, improvement of light extraction efficiency allows for reducing light reflected inside the lens (the secondary light). Accordingly, light irradiated on the first resin member 41 can be reduced, so that the deterioration of the first resin member 41 can be reduced. The second resin member 42 may be formed by any appropriate method, including compression molding, injection molding and the like. Otherwise, a material of the second resin member 42 with an optimized viscosity may be dripped or drawn on the light emitting element 1, which allows the surface tension of the second resin member 42 to form the lens-shape.

Wavelength Conversion Member 50

Further, the light emitting device may contain a wavelength conversion member 50. The wavelength conversion member 50 is a member to convert light of a first peak wavelength emitted by the light emitting element 1 into light of a second peak wavelength that is different from the first peak wavelength. For, the wavelength conversion member 50, a fluorescent material that can be excited by light from the light emitting element 1 can be used. Examples of, a fluorescent material that can be excited by a blue-color light emitting element or a ultraviolet light emitting element include a nitride-based fluorescent material such as a cerium-activated yttrium-aluminum garnet based phosphor (Ce:YAG), a cerium-activated lutetium aluminum garnet based phosphor (Ce:LAG), an europium and/or chromium-activated nitrogen-containing calcium aluminosilicate based phosphor ($CaO-Al_2O_3-SiO_2$), an europium-activated silicate based phosphor (($Sr,Ba)_2SiO_4$), a β sialon phosphor, a CASN-based phosphor, and a SCASN-based phosphor; a fluoride-based phosphor such as a KSF-based phosphor, a sulfide-based phosphor, a chloride-based phosphor, a silicate-based phosphor, a phosphate-based phosphor, a quantum dot phosphor and the like. The general formula of a KSF-based phosphor can be represented by $A2[M_{1-a}Mn_{4+a}F_6]$ ... (I), where A is at least one cation selected from the group consisting of $K^+$, $Li^+$, $Na^+$, $Rb^+$, $Cs^+$, and $NH^{4+}$, M is at least one element selected from the group consisting of Group 4 elements and Group 14 elements, and a satisfies $0.01<a<0.20$. Further, the wavelength conversion member 50 may be a fluoride-based phosphor represented by general formula (I) where A includes $K^+$ and M includes Si. Combinations of such fluorescent materials and a blue-color light emitting element or an ultraviolet light emitting element allows for manufacturing light emitting devices of various colors (e.g., a white-color-based light emitting device).

Though the wavelength conversion member 50 may be disposed at any appropriate position, preferably the wavelength conversion member 50 is disposed above or beside the light emitting element 1 so as to be directly irradiated with light from the light emitting element 1. For example, the wavelength conversion member 50 may be contained in the second resin member 42. This structure allows the light emitting device to emit mixed-color light in which light of the first peak wavelength emitted by the light emitting element 1 and light of the second peak wavelength emitted by the wavelength conversion member 50 are mixed. For example, with a blue-color LED for the light emitting element 1 and a fluorescent material such as YAG for the wavelength conversion member 50, a light emitting device to emit white-color light, which is mixture of blue-color light of the blue-color LED and fluorescence of yellow-color light emitted by the fluorescent material by being excited by the blue-color light, can be obtained.

Third Resin Member 43

The second resin member 42 covers the light emitting element 1 and the first resin member 41. The second resin member 42 may cover the light emitting element 1 so as to be in contact with the light emitting element 1. Alternatively, the second resin member 42 may cover the light emitting element 1 via a resin member that is different from the second resin member 42. In an example shown in FIG. 3, a third resin member 43 directly covers the light emitting element 1, and the second resin member 42 covers the light emitting element 1 via the third resin member 43. Note that, in the case where the light emitting element 1 is covered by the protective film 32, the third resin member 43 directly covers the protective film 32 formed on a surface of the light emitting element 1. The material of the third resin member 43 may be appropriately selected, and examples thereof include polycarbonate resin, epoxy resin, phenolic resin, silicone resin, acrylic resin, polymethylpentene resin, polynorbornene resin, modified resin of these resins, or hybrid resin containing at least one of these resins. In particular, for the material of the third resin member 43, dimethyl-based silicone resin or phenyl-based silicone resin which exhibits good light resistance is preferably employed.

Further, the third resin member 43 is preferably made of a resin having a gas barrier property with respect to hydrogen sulfide that is lower than that of the first resin member 41 and higher than that of the second resin member 42. With this arrangement, comparing with the case where the second resin member 42 directly covers the light emitting element 1, the third resin member 43 directly covering the light emitting element 1 allows for reducing sulfurization of a portion of the conductive member around the light emitting element 1. The third resin member 43 directly covers the light emitting element 1, so that the third resin member 43 preferably has higher light resistance than that of the first resin member 41. The first resin member 41 is less easily subjected to direct irradiation with light from the light emitting element 1. Accordingly, for a material of the first resin member 41, a resin that exhibits higher gas barrier property than that of the third resin member 43 is more preferable than selecting a resin exhibiting good light resistance. Examples of combination of such resins include epoxy resin for the first resin member 41, dimethyl-based silicone resin for the second resin member 42, and phenyl-based silicone resin for the third resin member 43.

Further, though the refractive index of the third resin member 43 may be appropriately selected, a high refractive index is preferable because it allows the difference in refractive index from the light emitting element 1 to be reduced. With the third resin member 43 having high refractive index, the difference between in refractive index of the light emitting element 1 and that of the third resin member 43 can be reduced, which allows the light extraction efficiency to be improved. Accordingly, the refractive index of the third resin member 43 is preferably 1.5 to 1.6. Examples of a resin having a high refractive index include phenyl-based silicone resin.

Further, the third resin member 43 is preferably spaced apart from the first resin member 41. Since the third resin member 43 directly covers the light emitting element 1, spacing the third resin member 43 apart from the first resin member 41 allows for reducing light from the light emitting element 1 being incident on the first resin member 41. This can reduce deterioration of the first resin member 41 due to light. In the case where the third resin member 43 is arranged in the recess, disposing an upper surface of the third resin member 43 to be lower than an upper surface of the side wall portion 15 is preferable because the third resin member 43 can be spaced apart from the first resin member 41 with ease. Further, the third resin member 43 may contain the above-described wavelength conversion member 50. With this arrangement, excitation occurs in the third resin member 43, so that light introduced from the third resin member 43 into the second resin member 42 may not be refracted and/or reflected for causing excitation in the second resin member 42. This can shorten the optical path in the second resin member 42. Accordingly, light from the light emitting element 1 incidents on the first resin member 41, which is covered by the second resin member 42, so that deterioration of the first resin member 41 can be reduced.

The wavelength conversion member 50 such as a fluorescent material may be evenly dispersed in the third resin member 43, or may be unevenly arranged in the third resin member 43 so as to be spaced apart from the light emitting element 1. With this arrangement, the wavelength conversion member 50 can be protected from light or heat emitted by the light emitting element 1. The wavelength conversion member 50 is not limited to be contained in the third resin member 43, and for example, may be contained in the second resin member 42. Further, in the second resin member 42, the wavelength conversion member 50 may be similarly evenly dispersed or predominantly distributed in a portion of the second resin member 42, or may be provided just on a surface of the resin or on a portion near the surface of the resin. Not only one kind but also two or more kinds of the wavelength conversion member may be used in combination. For example, a first wavelength conversion member may be disposed in the third resin member 43, and a second wavelength conversion member, which is different from the first wavelength conversion member, may be disposed in the second resin member 42.

Figure 5:
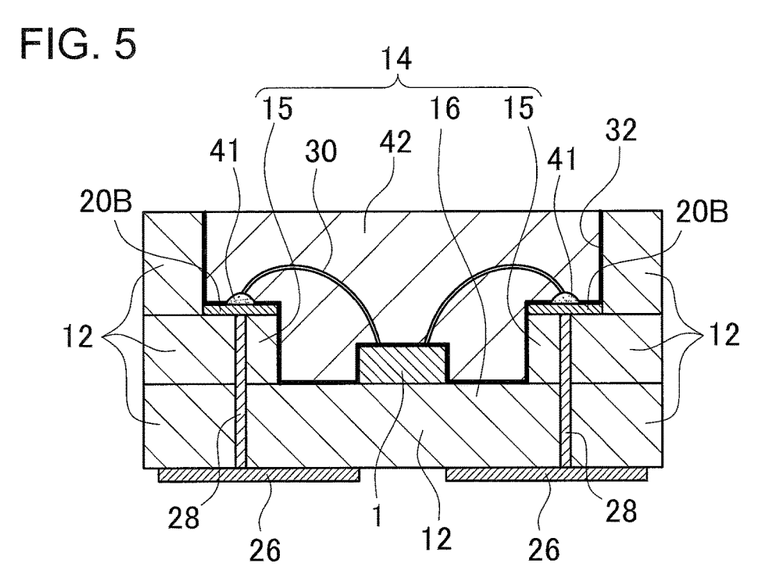
FIG. 5 is a cross-sectional view of a light emitting device according to a variant example.
Figure 6:
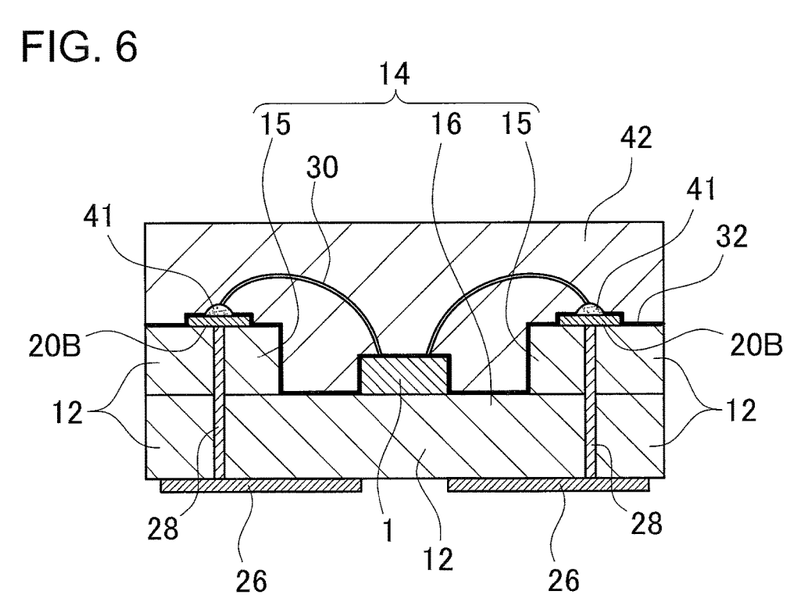
FIG. 6 is a cross-sectional view of a light emitting device according to another variant example.

The third resin member is not indispensable, and for example, as shown in cross-sectional views of FIGS. 5 and 6 as a variant example, the light emitting device may not include the third resin member. Further, for the conductive member, wirings may be employed in place of the leads. In the variant example shown in FIGS. 5 and 6, wirings 20B on an upper surface of a side wall portion 15 and back-surface electrodes 26 defining the lower surface of the base member 10 are electrically connected by vias 28. With this structure, electric power can be supplied through the back-surface electrodes 26. Note that, both the back-surface electrodes 26 and the vias 28 are each a part of the conductive member. The side wall portion 15 may have a stepwise shape as shown in FIG. 5. With the side wall portion 15 having a stepwise shape, the second resin member 42 covering the light emitting element 1 and the first resin member 41 can be formed in the base material 12 with ease.

Second Embodiment

Figure 7:
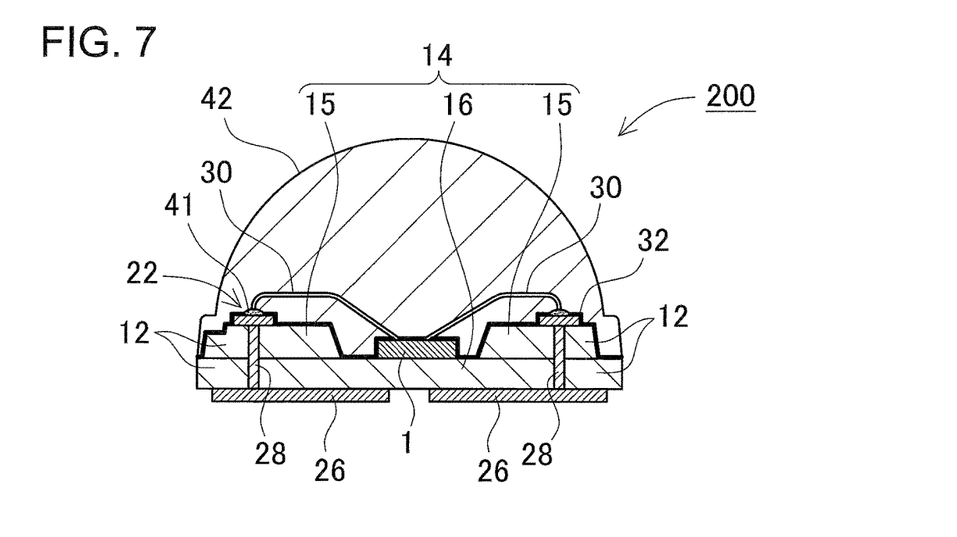
FIG. 7 is a cross-sectional view of a light emitting device according to a second embodiment.

FIG. 7 shows a cross-sectional view of a light emitting device according to a second embodiment, in which a recess is made of a base material of a base member. In the light emitting device shown in FIG. 7, a conductive member is buried in the base material. The base material forms a portion of a side wall portion 15 and portion of a bottom portion 16. Other portions of the bottom portion 16 are made of the conductive member. In this manner, the light emitting element 1 is mounted on the recess 14 defined by the side wall portion 15 and the bottom portion 16. To form this structure, bending of the conductive member is not indispensable, so that the base member can be easily molded. The side wall portion 15 and the bottom portion 16, each of which are a part of the base member, may be formed as separate members or as an integrated member.

Figure 8:
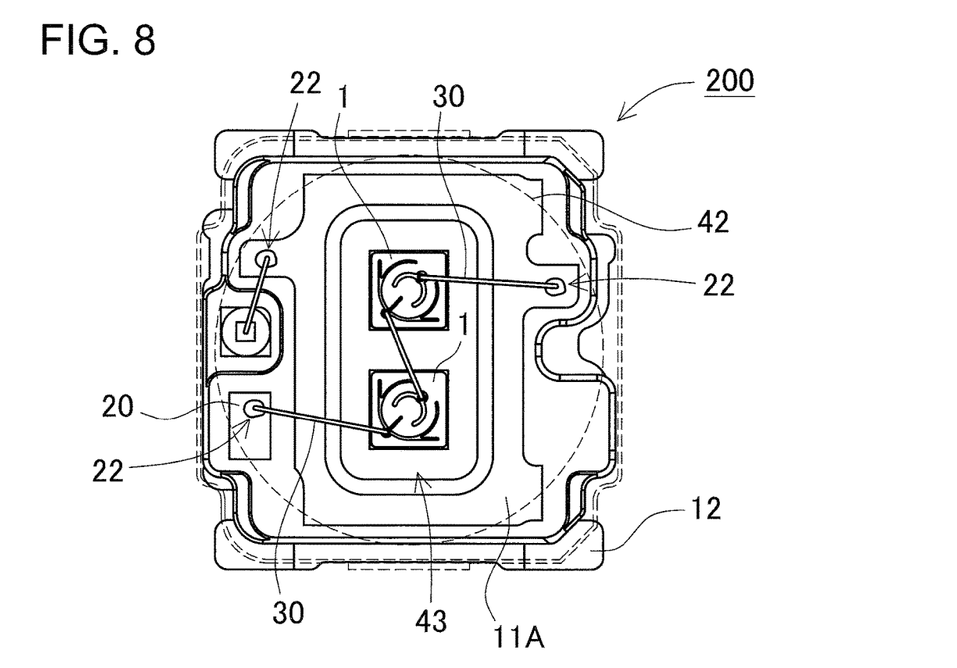
FIG. 8 is a plan view of the light emitting device according to the second embodiment.

In the description above, examples where just a single light emitting element is mounted on the base member are illustrated, but the scope of the present invention is not limited to such a structure and the light emitting device may include two or more light emitting elements. FIG. 8 exemplarily shows a plan view of a light emitting device including two light emitting elements 1. In this light emitting device 200 also, with a first resin member 41 covering the portion of the conductive member around the connecting portion 22 connecting the wire 30 and the conductive member, sulfurization of the portion of the conductive member around the connecting portion 22 can be reduced, so that disconnection of the wire 30 can be prevented. Note that, similarly to the first embodiment, the second resin member may cover the light emitting element 1 and the first resin member 41 via the third resin member 43, which directly covers the light emitting element 1.

Third Embodiment

In the embodiments described above, the first resin member 41 that may be poor in light resistance compared with the second resin member 42 is disposed at a position where the first resin member 41 is not easily subjected to direct irradiation with light from the light emitting element. In an embodiment shown in FIG. 3, the first resin member 41 is disposed on an upper surface of a side wall portion 15 defining the recess 14 at a position higher than an upper surface of a light emitting element 1, which can reduce deterioration of the first resin member 41 due to light irradiation. However, the scope of the present invention is not limited to such structure, and the first resin member may be appropriately disposed at a portion masked by the light emitting element. For example, a light shielding portion may be provided so that light emitted from the light emitting element is not directly incident on the first resin member. That is, a light shielding portion may be disposed on a line connecting the light emitting element and the first resin member. As a third embodiment, an example of such structure is shown in a cross-sectional view in FIG. 9, and in a plan view of FIG. 10. A light emitting device 300 shown in FIGS. 9 and 10 includes a base member 10C having conductive member and a light emitting element 1C mounted on a base member 10C. For the conductive member, wirings 20C may be used, and for example the conductive member is patterned on a surface of the base member 10C. Alternatively, the conductive member may be leads. The conductive member and the light emitting element 1C are electrically connected by at least one wire 30C.

Figure 9:
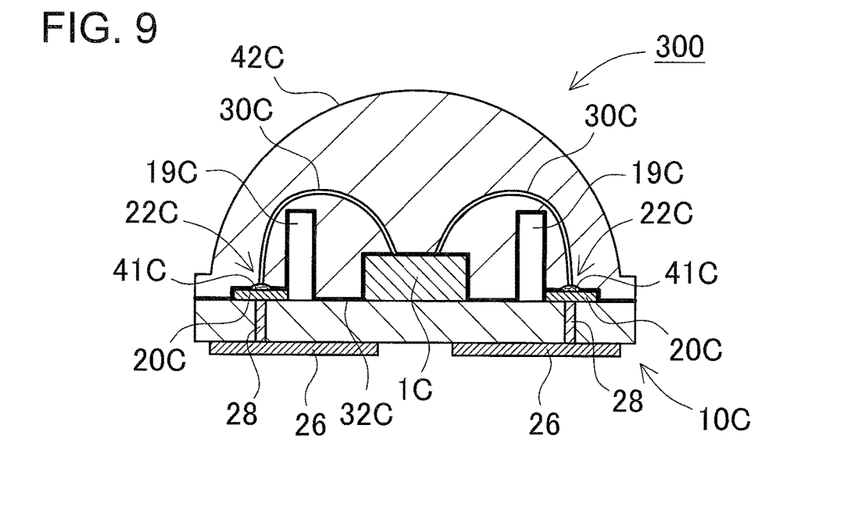
FIG. 9 is a cross-sectional view of a light emitting device according to a third embodiment.
Figure 10:
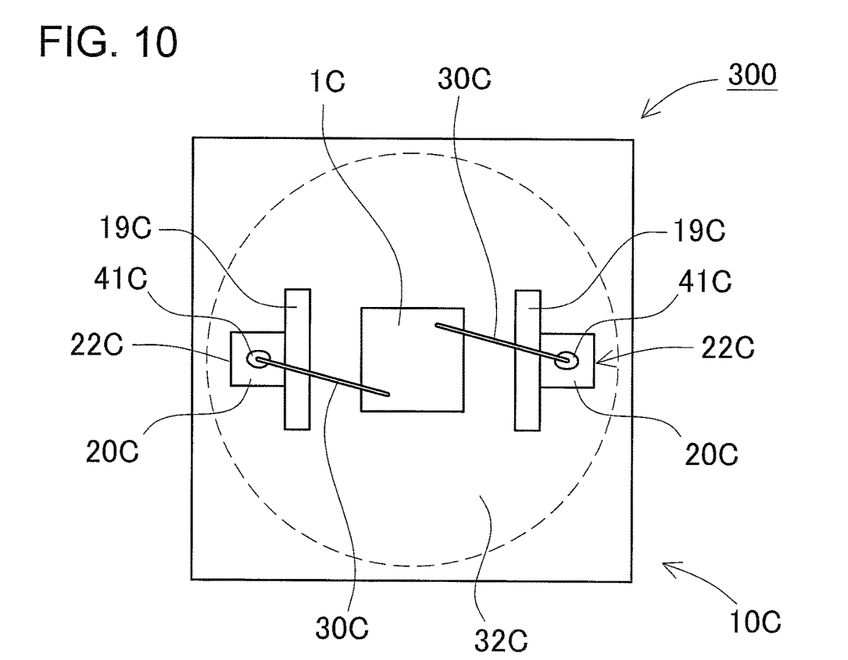
FIG. 10 is a plan view of the light emitting device according to the third embodiment.

Since the conductive member contains silver, the conductive member is preferably covered by a protective film 32C in order to prevent sulfurization of silver caused by hydrogen sulfide in the air. Further, the portion of the conductive member around connecting portion 22C connecting a conductive member and the wire 30C, which is not covered by the protective film 32C, is covered by a first resin member 41C exhibiting good gas barrier property with respect to hydrogen sulfide, similarly to the first embodiment. Further, a surface of the base member 10C is covered by a second resin member 42C together with the light emitting element 1C and the first resin member 41C. The second resin member 42C has a gas barrier property with respect to hydrogen sulfide lower than that of the first resin member 41C.

In the present embodiment, a light shielding portion 19C is provided for protecting the first resin member 41C, which may perform poor light resistance than the second resin member 42C, from light emitted from the light emitting element 1C. The light shielding portion 19C is disposed on a line connecting the light emitting element 1 and the first resin member 41. With this arrangement, a primary light from the light emitting element 1C can be shielded by the light shielding portion 19C. This can reduce deterioration of the first resin member 41C due to being exposed to the primary light from the light emitting element 1C.

The light shielding portion 19C may be made of a material being same with or different from a material of the base member 10C, for example the base material 12 and/or the conductive member. The light shielding portion 19C may be formed integrally with the base member 10C. Further, in the present embodiment, though the light shielding portion 19C has a plate-like shape, a shape of the light shielding portion 19C is not limited to this. For example, the light shielding portion 19C may have a semicircular shape in a plan view so as to surround the connecting portion, or may be bent and have an eaves-like shape in a side view. Further, the light blocking portion may be a light reflective member and have an inclined surface at a portion facing the light emitting element, so that the light blocking portion can also serve as a member that reflects light emitted from the light emitting element.

Figure 11:
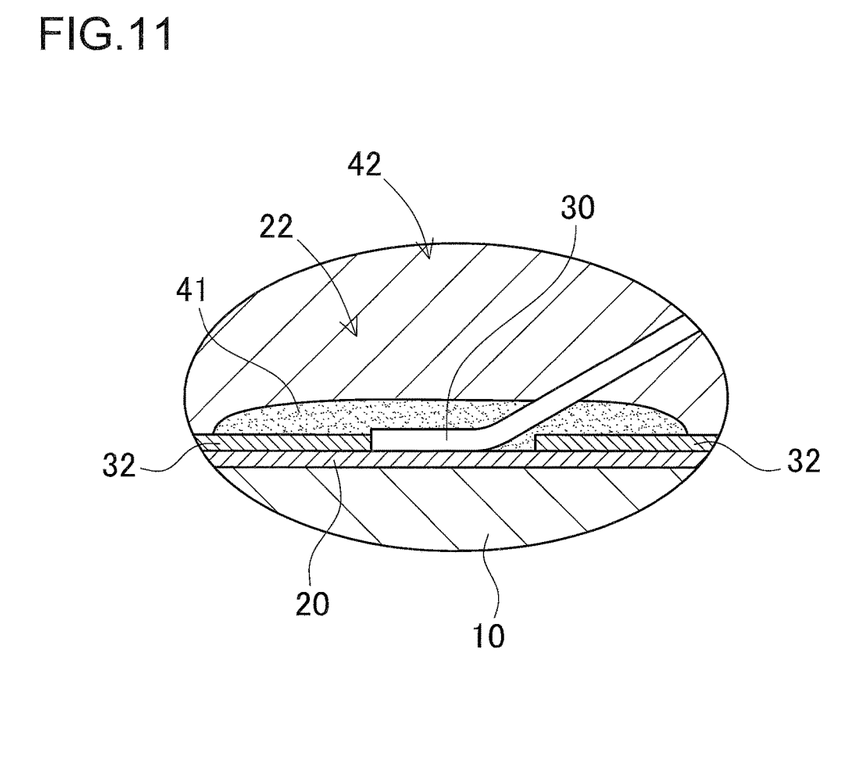
FIG. 11 is an enlarged cross-sectional view of a portion where a connecting portion of a light emitting device according to a variant example is covered by a first resin member.

Note that, while the structure in which the ball 24 is interposed at the connecting portion 22 is described in examples of FIG. 4, etc., the scope of the present invention is not limited to such structure, and the ball 24 may not be used. For example, as a variant example shown in FIG. 11, the wire 30 may be directly connected to the conductive member such as wirings. Also in this case, with a conventional sputtering method for forming the protective film, a portion masked by the wire 30 may include a region not covered by the protective film. Supplying the first resin member 41 by potting allows the connecting portion 22 and the portion around the connecting portion can be surely covered, so that disconnection of the wire 30 by sulfurization can be effectively prevented. Note that, FIG. 11 shows an example in which the wire is connected by wedge bonding.

Fourth Embodiment: Method of Manufacturing Light Emitting Device

A method of manufacturing the light emitting device according to the first and second embodiments will be described as a fourth embodiment. First, the light emitting element 1 is mounted on the recess 14 of the base member 10. The recess 14 is includes the side wall portion 15 and the bottom portion 16, and the light emitting element 1 is mounted on the bottom portion 16 of the recess 14. Further, the conductive member is disposed on the upper surface of the side wall portion 15. At this time, the light emitting element 1 is arranged so that its upper surface is located at a level lower than the upper surface of the side wall portion 15.

Next, the electrodes of the light emitting element 1 and the conductive member arranged on the upper surface of the side wall portion 15 of the base member 10 are electrically connected by the wire 30. Further, the protective film 32 covering at least a portion of the conductive member is formed. Though the protective film 32 may be formed by any appropriate method, preferably it is formed by sputtering, which realizes high adhesion between the conductive member and the protective film 32. Then, the protective film 32 covering the conductive member is formed to be spaced apart from at least the portion of the connecting portion 22 connecting the wire 30 and the conductive member.

Next, the first resin member 41 continuously covers at least a part of each of the protective film 32, the portion of the conductive member around the connecting portion 22, and the wire 30. The first resin member 41 may be formed by any appropriate method including potting, spraying and the like. In particular, forming by potting is preferable. With this method, the first resin member 41 can be easily formed even in the spaces masked by the wire 30 around the connecting portion 22 connecting the wire 30 and the conductive member, which is difficult to be achieved by sputtering or the like. Further, filler for adjusting viscosity may be mixed into the uncured first resin member 41. Mixing the filler allows the flowability of the uncured first resin member 41 to be controlled to hold the first resin member 41 in the desired region.

Then, the upper surface of the base member 10 is covered by the second resin member 42. The second resin member 42 is a resin having lower gas barrier property with respect to hydrogen sulfide than that of the first resin member 41, and covers the light emitting element 1 and the first resin member 41. With this arrangement, the first resin member 41 covering the portion of the conductive member around the connecting portion 22 is not easily subjected to direct irradiation with light emitted by the light emitting element 1, so that deterioration of the first resin member 41 due to light can be suppressed. Further, with high gas barrier property of the first resin member 41, the portion of the conductive member around the connecting portion 22 can be protected, whereby disconnection of the wire 30 from the conductive member can be prevented.

In particular, by adjusting the viscosity of the first resin member 41 with filler and covering the portion of the conductive member around the connecting portion with first resin member 41 using potting, the first resin member 41 can enter and cover the masked portion, which cannot be covered by sputtering or the like. Thus, disconnection of the wire 30 from the conductive member can be easily prevented.

Note that, before the second resin member 42 is formed, the third resin member 43 that is spaced apart from the first resin member 41 and directly covers the light emitting element 1 may be formed. The third resin member 43 may be formed by any appropriate method including potting, spraying and the like. In particular, the third resin member 43 is preferably formed by potting. With this method, the third resin member 43 that covers the surface of the light emitting element 1 can be easily formed. Formation of the third resin member 43 allows for further preventing disconnection of the wire.

Fifth Embodiment: Method of Manufacturing Light Emitting Device

Next, a method of manufacturing the light emitting device according to the third embodiment will be described as a method of manufacturing a light emitting device according to a fifth embodiment. First, the light emitting element 1 is mounted on the base member 10. The base member 10 includes the light shielding portion so that the first resin member is not directly irradiated with light from the light emitting element 1. The light emitting element 1 may be mounted after providing the base member 10 including the light shielding portion. Alternatively, the light shielding portion may be formed after the light emitting element 1 is mounted.

The wire, the protective film, the first resin member, and the second resin member can be formed by the same method as in the fourth embodiment. Note that, in the present embodiment, the first resin member is formed so as not to be directly irradiated with light from the light emitting element 1. That is, the light shielding portion is arranged on a line connecting between the light emitting element 1 and the first resin member 41. Similarly to the fourth embodiment, before the second resin member 42 is formed, the third resin member 43 may be formed so as to be spaced apart from the first resin member 41 and directly cover the light emitting element 1.

The light emitting device and the method of manufacturing the same according to embodiments of the present invention are suitably applicable to an illumination light source, an LED display, a light source of a backlight for a liquid crystal display apparatus and the like, a traffic light, an illuminated switch, various sensors and indicators, and other general consumer use light sources.

It should be apparent to those with an ordinary skill in the art that while various preferable embodiments of the invention have been shown and described, it is contemplated that the scope of the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a base member having a conductive member containing silver;
    a light emitting element disposed on the base member;
    a wire electrically connecting the light emitting element and the conductive member;
    a protective film covering the conductive member so as to be spaced apart at least from a portion of a connecting portion connecting the wire and the conductive member; and
    a first resin member continuously covering at least a portion of each of the protective film, a portion of the conductive member around the connecting portion, and the wire, the first resin member having a first gas barrier property with respect to hydrogen sulfide and a first light resistance;
    a second resin member covering the light emitting element and the first resin member and having a second gas barrier property with respect to hydrogen sulfide lower than the first gas barrier property and a second light resistance higher than the first light resistance; and
    a light shielding portion disposed on at least a portion of a surface of the base member, the light shielding portion being disposed on a line connecting the light emitting element and the first resin member.

2. The light emitting device according to claim 1, wherein the first resin member is an epoxy resin.

3. The light emitting device according to claim 1, wherein the first resin member has a carbon-carbon bond.

4. The light emitting device according to claim 1, wherein the second resin member is a dimethyl-based silicone resin.

5. The light emitting device according to claim 1, wherein the first resin member has a thickness in a range of 50 μm to 200 μm inclusive.

6. The light emitting device according to claim 1, wherein the second resin member has a lens-shape.

7. The light emitting device according to claim 1, further comprising:
    a third resin member covering the light emitting element, wherein
    the second resin member covers and the first resin member and the light emitting element via the third resin member,
    the third resin member has a third gas barrier property with respect to hydrogen sulfide that is lower than the first gas barrier property but higher than the second gas barrier property, and
    the third resin member is spaced apart from the first resin member.

8. The light emitting device according to claim 7, further comprising a wavelength conversion member provided in the third resin member to convert light having a first peak wavelength emitted by the light emitting element into light having a second peak wavelength different from the first peak wavelength.

9. The light emitting device according to claim 7, wherein the third resin member is a phenyl-based silicone resin.

10. The light emitting device according to claim 7, wherein a refractive index of the third resin member is in a range of 1.5 to 1.6.

11. The light emitting device according to claim 1, wherein the first resin member contains first light reflecting particles to reflect light emitted by the light emitting element.

12. The light emitting device according to claim 1, wherein the first resin member is disposed at a position where the first resin member is not directly irradiated with light emitted by the light emitting element.

* * * * *